United States Patent
Wellmeier (10) Patent No.: US 11,171,275 B2
(45) Date of Patent: Nov. 9, 2021

(54) METHOD OF MANUFACTURING AN LED ASSEMBLY

(71) Applicant: Lumileds LLC, San Jose, CA (US)

(72) Inventor: Petra Wellmeier, Aachen (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/800,732

(22) Filed: Feb. 25, 2020

(65) Prior Publication Data

US 2020/0274044 A1  Aug. 27, 2020

(30) Foreign Application Priority Data

Feb. 26, 2019  (EP) ..................................... 19159441

(51) Int. Cl.
| | |
|---|---|
| *H01L 33/64* | (2010.01) |
| *H01L 25/075* | (2006.01) |
| *H01L 25/16* | (2006.01) |
| *H01L 33/62* | (2010.01) |

(52) U.S. Cl.
CPC ........ *H01L 33/648* (2013.01); *H01L 25/0753* (2013.01); *H01L 25/167* (2013.01); *H01L 33/62* (2013.01); *H01L 33/647* (2013.01); *H01L 2933/0066* (2013.01); *H01L 2933/0075* (2013.01)

(58) Field of Classification Search
CPC . H01L 33/648; H01L 25/0753; H01L 25/167; H01L 33/62; H01L 33/647; H01L 2933/0066; H01L 2933/0075; H01L 23/42; H01L 23/427; F21S 41/192; F21S 45/47; F21S 41/151
See application file for complete search history.

(56) References Cited

U.S. PATENT DOCUMENTS

| 2005/0006754 A1 | 1/2005 | Mehmet et al. |
| 2008/0093962 A1* | 4/2008 | Kim ........................ F28D 15/02 313/46 |

(Continued)

FOREIGN PATENT DOCUMENTS

| CN | 202217707 U | 5/2012 |
| CN | 102497726 A | 6/2012 |
| WO | 2007/137097 A2 | 11/2007 |

OTHER PUBLICATIONS

Hyeong-Gi Lee et al: "Vertically aligned nickel nanowire/epoxy composite for electrical and thermal conducting material", Electronic Components and Technology Conference (ECTC), 2012 IEEE 62nd, IEEE, May 29, 2012 (May 29, 2012), pp. 2087-2090, DOI: 10.11 09/ECTC.2012.6249129, ISBN: 978-1-4673-1966-9.

(Continued)

*Primary Examiner* — Victor A Mandala
(74) *Attorney, Agent, or Firm* — Volpe Koenig (57) ABSTRACT

A method of manufacturing an LED assembly is described. The method includes providing an LED package comprising one or more LEDs arranged in a support body and thermal and electrical contact regions on one or more surfaces of the support body. The method further includes providing a heatpipe and forming a thermal contact between a contact region of the LED package and a first end region of the heatpipe. An LED package, an LED assembly, and an LED lighting arrangement are also described.

20 Claims, 7 Drawing Sheets

(56) References Cited

U.S. PATENT DOCUMENTS

2016/0312978 A1* 10/2016 Park ........................ F21V 29/70
2020/0326044 A1* 10/2020 Haenen ..................... F21K 9/68

OTHER PUBLICATIONS

Written Opinion of the International Searching Authority dated Sep. 3, 2020 for PCT International Application No. PCT/EP2020/054066.
International Search Report dated Apr. 17, 2020 for PCT International Application No. PCT/EP2020/054066.
Extended European Search Report dated Aug. 9, 2019 for European Patent Application No. 19159441.5.
Xiaopeng Li et al., "Nanowire Joining Methods", The Open Surface Science Journal, vol. 3, No. 1, Jan. 8, 2011 (Jan. 8, 2011), p. 91-104.

* cited by examiner

METHOD OF MANUFACTURING AN LED ASSEMBLY

CROSS REFERENCE TO RELATED APPLICATION(S)

This application claims the benefit of EP Patent Application Serial No. 19159441.5, filed Feb. 26, 2019, which is incorporated by reference as if fully set forth.

FIELD OF INVENTION

The invention describes a method of manufacturing an LED assembly, an LED package an LED assembly, and an LED lighting arrangement.

BACKGROUND

Light-emitting diodes (LEDs) are becoming more widely used in applications that require high light output and a small light source size. A closely-spaced arrangement of direct-emitting LEDs may be used in applications such as automotive front lighting. The LEDs can be provided as a semiconductor structure in the form of a wafer-level package. However, the need to arrange the LEDs very close together leads to problems with thermal management. Since light output decreases when an LED becomes too hot, it is very important to ensure that heat is transported effectively and rapidly away from the LED package. This problem is becoming more significant as semiconductor manufacturing techniques lead to increasing current density. The heat from an LED package is generally channeled to a heatsink, for example a relatively large metal body with large surface area. For reasons of stability, the LED package is generally mounted on an interposer, for example a small printed circuit board (PCB), and the interposer in turn is mounted on the heatsink. The steps taken to improve heat transfer have generally focused on improving the thermal path from the LED to the interposer and from the interposer to the heatsink. However, the bulk of such a heatsink and the need to have it in close proximity to the LEDs place constraints on the overall design of the lighting application. One way of avoiding such design constraints may be to use a heat bridge between the LED arrangement and a heatsink. The LED arrangement and interposer can be mounted at one end of the heat bridge, and the heatsink can be mounted at the other end of the heat bridge. However, the effectiveness of the heat transfer from the LED arrangement to the heat bridge can be significantly reduced by the presence of the interposer.

Therefore, it is an object of the invention to improve the transfer of heat from such LED packages to a heatsink.

SUMMARY

The object of the invention is achieved by the method of claim 1 of manufacturing an LED assembly; by the LED package of claim 5; by the LED assembly of claim 9; and by the LED lighting arrangement of claim 12.

According to the invention, the method of manufacturing an LED assembly comprises the steps of providing an LED package comprising one or more LED dies arranged in a support body and comprising thermal and electrical contact region. A contact region may be understood as a metal region that is essentially flush with a surface of the support body. The inventive method further comprises a steps of providing a heatpipe and forming a direct thermal contact between a thermal contact region of the LED package and a first end region of the heatpipe.

An advantage of the inventive method is that the LED assembly is characterized by a very low heat transmission resistance in the heatpipe path between LED dies and heatsink. The rapid transfer of heat away from the LED dies supports their performance. The LED package shall be understood to comprise an anode contact region and a cathode contact region, and may also comprise an additional thermal contact region. However, as shall be explained below, a dedicated thermal contact region may not be necessary, since at least one embodiment permits heat to be transported away from the LED package through the electrical contact regions.

In the context of the invention, a heatpipe is to be understood as a hollow metal tube, preferably with one or more flat side faces, that is connected between the LED package and a heatsink. The heatpipe is preferably made of a metal such as copper, since this has very good thermal conductivity. The working fluid can be water, for example. An advantage of the inventive method is that it provides a straightforward way of providing a thermal path from an LED package to a heatsink. The thermal contact region of the LED package is directly connected into the thermal path, without having to first pass through an interposer or similar. The expression "direct thermal contact" is to be understood to mean that the hot thermal contact pad of the LED package is in direct physical contact with the heatpipe. This is achieved by thermally connecting the thermal contact region of the LED to a surface of the heatpipe. Such a direct thermal connection is characterized by a favourably low thermal resistance. The heatpipe is effectively a bridge between the LED package and a heatsink, and allows the heatsink to be positioned at a distance from the LED, while at the same time ensuring that heat is quickly transferred from the hot LEDs of the LED package to the heatpipe and heatsink. This compares favourably with conventional designs, in which such an LED package is mounted onto a heatsink by means of an intermediate body or interposer. In the inventive method, the need for such an interposer is eliminated, and design freedom is gained by the possibility of placing the heatsink further away from the LED package.

According to the invention, the LED package comprises a semiconductor structure with one or more LED dies arranged in a support body; an anode contact region and a cathode contact region on the underside of the support body; a thermal contact region on the underside of the support body; and a nanowire field formed at least over the thermal contact region.

An advantage of the inventive LED package is that the thermal connection between the LED package and a heatpipe can be a very favourable metal-to-metal connection, since a nanowire field (also referred to as a nanowire "lawn") comprises a very dense arrangement of short, thin metal wires. A heatpipe can be prepared with favourably low effort to also comprise a complementary nanowire field, and the LED package can then be thermally connected to the heatpipe by pressing the complementary nanowire fields against each other to form a "nanoweld". Of course, the electrical connection between the LED array and the driver circuit can also be made by providing nanowire fields in the anode/cathode contact regions. The actual bond between complementary nanowire fields is essentially a friction bond that forms by pressing one nanowire field onto another. When made from a metal such as copper, the nanowires are unaffected by the high junction temperatures of the LED dies.

According to the invention, the LED assembly comprises a heatpipe extending between an embodiment of the inventive LED package and a heatsink. The heatpipe comprises a nanowire field formed at one outer end, and the LED package is thermally connected to the heatpipe by a nanoweld between the nanowire field at that end of the heatpipe, and the complementary nanowire field formed in the thermal contact region of the LED package. At the other end of the heatpipe, a heatsink is thermally connected to the heatpipe.

According to the invention, the LED lighting arrangement comprises an embodiment of the inventive LED assembly, and a driver circuit comprising circuit components mounted on a PCB and comprising conductive tracks for connection to the LED assembly. The LED package of the LED assembly is connected to the driver circuit by electrical connections between the anode and cathode contact regions of the LED package and the corresponding conductive tracks on the PCB.

The inventive LED lighting arrangement is characterized by favourable thermal behaviour, since heat from the LED(s) during operation can be rapidly and reliably transferred through the nanowelds to the heatpipe, and via the heatpipe to a heatsink, even if this heatsink is positioned at some distance from the LED package.

The dependent claims and the following description disclose particularly advantageous embodiments and features of the invention. Features of the embodiments may be combined as appropriate. Features described in the context of one claim category can apply equally to another claim category.

The LED package can be provided as a semiconductor structure that is manufactured as a chip-level package or a wafer-level package, for example, and contained in a thin support body. A support body can be made by enclosing the undersides and the sides of one or more LED dies with a material such as white silicone, formed in the shape of a thin tile. The emission face(s) may be covered with a phosphor material to perform wavelength conversion, or by any suitable protective coating. Metal contact regions can be provided on one or more surfaces of such a thin white silicone "tile". Alternatively, the LED dies may arranged on a thin ceramic carrier and then enclosed in a thin white silicone "tile" as described above. In such an embodiment, the contact regions may be provided at the outside of the ceramic carrier.

Contact regions (electrical and/or thermal) can be on the upper side (i.e. on the emission face side) and/or on the underside. Without restricting the invention in any way, it may be assumed in the following that the emission surface of an LED is on the upper side of the package, and that electrode contact regions and one or more thermal contact regions are provided on the underside of the package.

In a preferred embodiment of the invention, the LED package comprises two or more series-connected LEDs arranged in the support body, which preferably has a thickness of less than 1.0 mm. For example, the thickness of the package may be in the order of 0.3 mm or less.

In a preferred embodiment of the invention, a nanowire field is made by performing electrolytic growth over the region in which the nanowire field is to be grown. The region can be prepared by depositing a seed layer with the desired area. During the electrolytic growth procedure, very thin structures—the nanowires —grow from the seed layer. The width and length of the nanowires can be determined by appropriate choice of process parameters. Preferably, the nanowires in a nanowire field have a length of at most 80 µm, more preferably at most 60 µm. Preferably, the nanowires in a nanowire field have a length of at least 20 µm, more preferably at least 40 µm. Preferably, the density of the nanowires in a nanowire field is in the region of $10^3$-$10^6$ wires per $mm^2$.

The heatpipe used to connect the LED package and the heatsink is preferably formed as an elongate metal tube, for example a one-piece tube of copper, aluminium, stainless steel, or other good thermal conductor. The material and dimensions of the heatpipe, and the type of working fluid to use, are preferably chosen on the basis of various parameters such as the expected LED temperatures, a minimum thermal flux, the system geometry, etc. For example, a copper heatpipe may be provided in the form of a hollow rod with uniform cross-sectional shape. A favourable cross-sectional shape may be a triangle, for example an equilateral triangle, since a tube with such a cross-sectional shape is able to withstand bending. A heatpipe with a triangular or other polygonal cross-section shape also provides several surfaces to which a heatsink may be attached. Since a heatpipe ensures that the heatsink is at a distance from the LED package, the heatsink can even be in the same plane as the LED package, i.e. the heatsink and the LED package can be attached to the same surface of the heatpipe, one at each end. In contrast to prior art heatpipes, the heatpipe used in the invention does not require any wicking or capillary mesh in the interior, since the shape of the heatpipe encourages condensed working fluid to return from the cool end to the hot end of the heat pipe.

In the inventive LED assembly, the thermal connection between the LED package and the heatpipe is the metal nanoweld formed by pressing together the complementary nanowire fields that were formed in the thermal contact region of the LED package, and on the heatpipe. Such a metal nanoweld is also suitable for making an electrical connection. Therefore, in a further preferred embodiment of the invention, the LED package also comprises a nanowire field formed over the anode contact region and a nanowire field formed over the cathode contact region. To make the electrical connections between the LED package and the driver circuit, complementary nanowire fields are formed for example on corresponding conductive tracks of a PCB, and nanowelds are formed by pressing the nanowire fields of the electrode contact regions onto the complementary nanowire fields formed on the conductive tracks. Alternatively, an electrical connection between the LED package and the PCB can also comprise a heatpipe, for example a first heatpipe connected between the LED package anode contact region and a corresponding conductive region on the PCB, and a second heatpipe connected between the LED package cathode contact region and a corresponding conductive region on the PCB. In such an embodiment, the heatpipes are preferably electrically isolated from each other.

The thermal path from the heatpipe can terminate at a heatsink. To this end, a heatsink can be mounted at the other end of the heatpipe, for example by using a suitable thermally conductive adhesive, by welding, etc. In a preferred embodiment of the invention, the thermal connection between heatpipe and heatsink is also done by providing appropriate nanowire fields and pressing these together to form a nanoweld.

Other objects and features of the present invention will become apparent from the following detailed descriptions considered in conjunction with the accompanying drawings. It is to be understood, however, that the drawings are designed solely for the purposes of illustration and not as a definition of the limits of the invention.

BRIEF DESCRIPTION OF THE DRAWING(S)

In the drawings, like numbers refer to like objects throughout. Objects in the diagrams are not necessarily drawn to scale.

DETAILED DESCRIPTION OF THE PREFERRED EMBODIMENT(S)

Figure 1A:
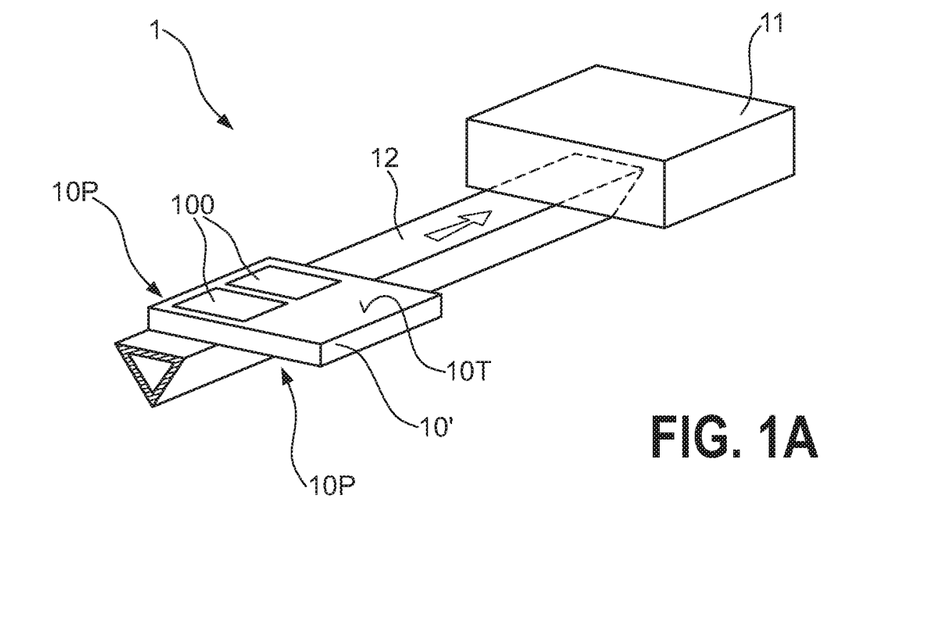
FIGS. 1A and 1B illustrate an embodiment of the inventive LED assembly.
Figure 1B:
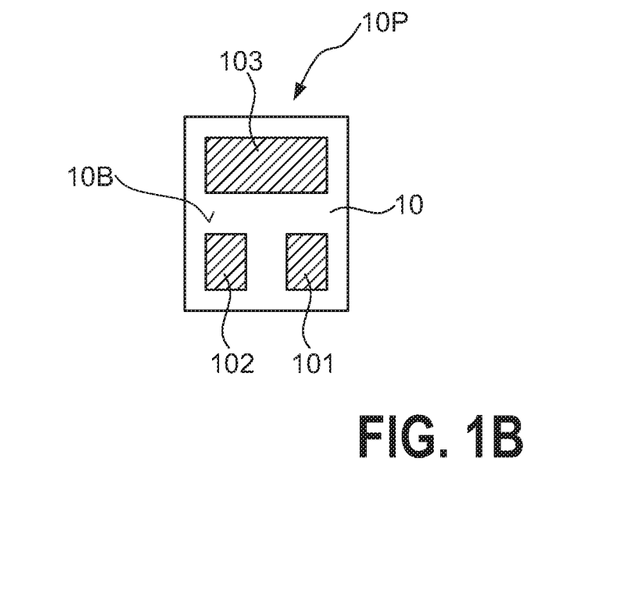

FIG. 1A shows an embodiment of the inventive LED assembly 1. The diagram shows an LED package 10P, comprising two LEDs 100 embedded in a support body 10 made from a material such as white silicone as described above. The LED package 10P comprises only this thin tile-like body 10, and does not need to be mounted onto any interposer or similar carrier structure. The LEDs 100 may be assumed to be electrically connected in series. On the underside of the LED package 10P, as shown in FIG. 1B, an anode contact pad 101 and a cathode contact pad 102 are provided for electrically connecting the LED package 10P into a circuit. A thermal contact region 103 is also provided. Instead of mounting the LED package 10P onto an interposer by forming a thermal connection between the thermal contact regions of the LED package 10P and the interposer, and then forming a further thermal connection between the interposer and a heatsink, the thermal contact 103 of the LED package 10P is directly mounted to a heatpipe 12 in the inventive LED assembly 1. The heatpipe 12 extends between the LED package 10P and a heatsink 11. With suitable choice of material and dimensions, etc., the heatpipe 12 offers a path with very low thermal resistance to the heatsink 11. This is important for LED arrays that are driven with high current density. Because the heatpipe 12 facilitates rapid heat transport away from the LEDs 100, the heatsink 11 can be arranged at a considerable distance from the LED package 10P, allowing greater design flexibility. In this exemplary embodiment, the heatpipe 12 is provided as an elongate metal part with a triangular cross-section. This shape has the advantage that a capillary wick or mesh structure (used in prior art heatpipes to transport the condensed working fluid back to the hot end) is not required since this shape creates a pressure difference between both ends of the heatpipe 12. Therefore the dimensions of such a heatpipe 12 can be significantly smaller than prior art heatpipes that are constructed to accommodate a wicking mesh structure. The thermal contact region 103 of the LED package 10P can be bonded to the heatpipe 12 using a thermally conductive adhesive, for example. Similarly, the heatsink 11 can be bonded to the heatpipe 12 using a thermally conductive adhesive.

The heatpipe 12 is shown as a hollow straight tube with uniform triangular cross-section, and may be assumed to be made of a metal such as copper and to carry a working fluid (not shown). The LED package 10P and the heatsink 11 are attached to a flat face of the heatpipe 12, so that the apex of the triangular shape points downwards. Condensate collects in the lower region of the heatpipe 12 at the heatsink end, and travels back to the LED end. Heat from the LEDs 100 causes the working fluid to vaporize at the LED end, and convection currents carry the vapour to the heatsink end, where the cycle repeats.

A straight or elongate shape is preferred for the heatpipe 12, but it shall be understood that the geometry and cross-section of the heatpipe can, if necessary, be modified within certain limits to suit the requirements of the application. For example, a heatpipe can include a moderate curve in order to thermally connect the LED package to a heatsink arranged at a slight offset. Although the diagrams show the heatpipe 12 in open cross-section, it shall be understood that the heatpipe 12 is closed at both ends to contain the working fluid, for example water.

Figures 2A, 2B:
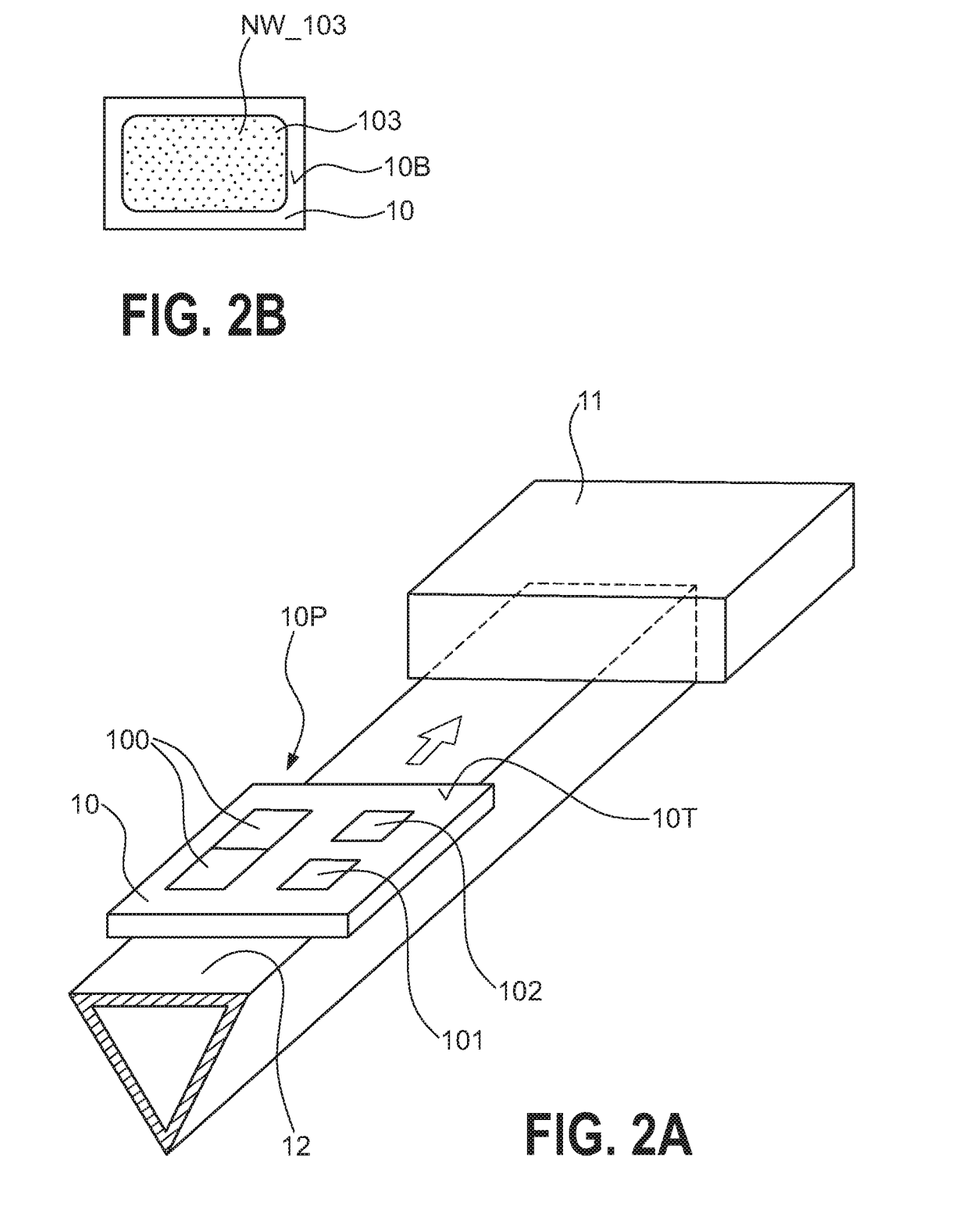
FIGS. 2A and 2B illustrate a further embodiment of the inventive LED assembly.

FIGS. 2A and 2B illustrate a further preferred embodiment of the inventive LED assembly 1. Here, the anode contact pad 101 and cathode contact pad 102 are provided at the upper surface of the support body 10, and the thermal contact region 103 is formed over almost the entire underside of the LED package 10P as shown in FIG. 2B. This allows the thermal connection between LED package 10P and heatpipe 12 to be favourably large. Again, this thermal bond can be made by a nanoweld as described above, in which case the thermal contact region 103 of the LED package 10P is treated to grow a nanowire lawn NW_103, and a corresponding lawn is grown in an appropriate region of the heatpipe 12.

Figure 3A:
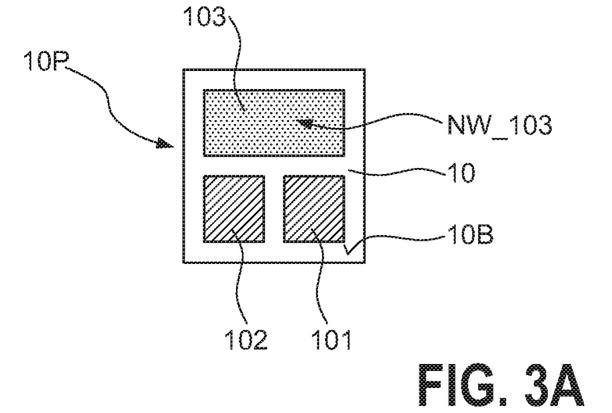
FIGS. 3A-3C illustrate a further embodiment of the inventive LED assembly.
Figure 3B:
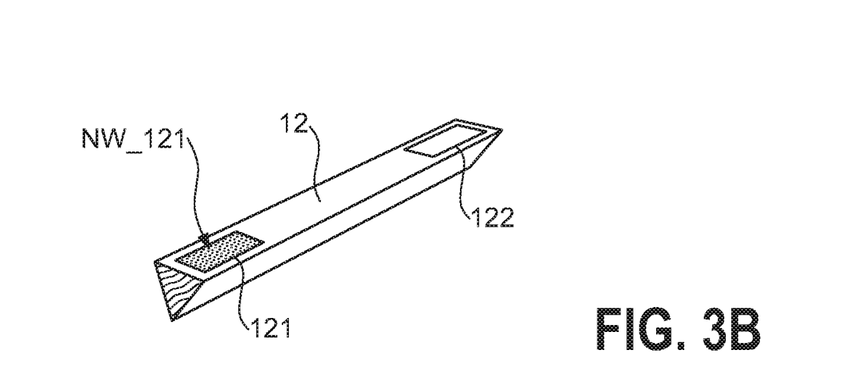
Figure 3C:
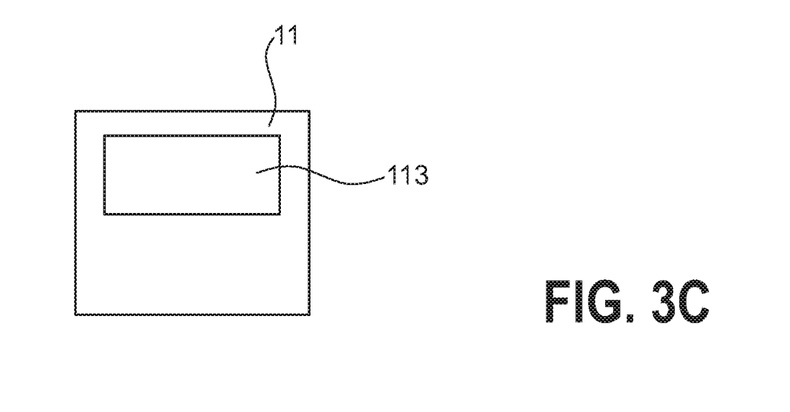

FIG. 3A shows an LED package 10P prepared for use in a preferred embodiment of the inventive LED assembly 1. Here, the thermal contact region 103 of the LED package 10P has been prepared by growing a nanowire field NW_103 over the area of the thermal contact region 103. FIG. 3B shows a heatpipe 12 for use with this embodiment of the LED package 10P. Here, the thermal contact region 121 at a first end of the heatpipe 12 has been prepared by growing a nanowire field NW_121 over the area of the thermal contact region 121. To bond the LED package 10P to the heatpipe 12, the nanowire fields NW_103, NW_121 are pressed together. The metal nanowires of the nanowire fields NW_121, NW_103 are then part of the thermal path between the LED package 10P and the heatpipe 12. In this embodiment, the heatpipe 12 can be attached to the heatsink 11 by means of a thermal bond between a contact region 113 of the heatsink 11 (shown in FIG. 3C) and a corresponding contact region 122 on the heatpipe 12.

Figure 4A:
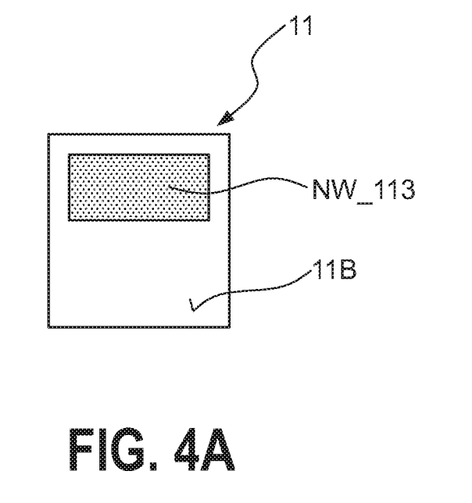
FIGS. 4A and 4B illustrate a further embodiment of the inventive LED assembly.
Figure 4B:
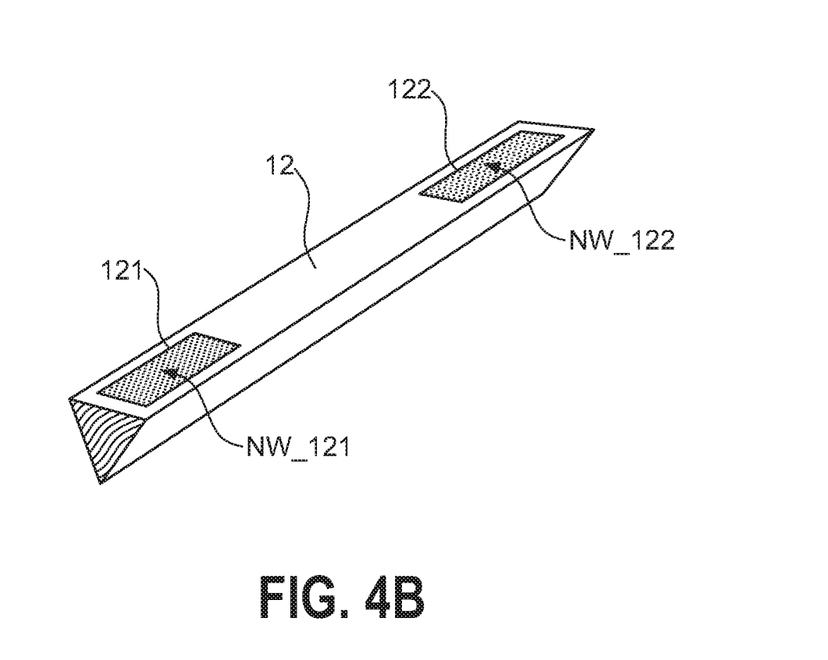

FIG. 4A shows a heatsink 11 prepared for use in a further preferred embodiment of the inventive LED assembly 1. Here, the thermal contact region 113 of the heatsink 11 has been prepared by growing a nanowire field NW_113 over the area of the thermal contact region 113. FIG. 4B shows a heatpipe 12 for use with this embodiment of the heatsink 11. Here, the thermal contact region 122 at the second end of the heatpipe 12 has been prepared by growing a nanowire field NW_122 over the area of the thermal contact region 122. To thermally connect the heatsink 11 to the heatpipe 12, the nanowire fields NW_122, NW_113 are pressed together. The metal nanowires of the nanowire fields NW_122, NW_113 are then part of the thermal path between the heatpipe 12 and the heatsink 11.

Figure 5A:
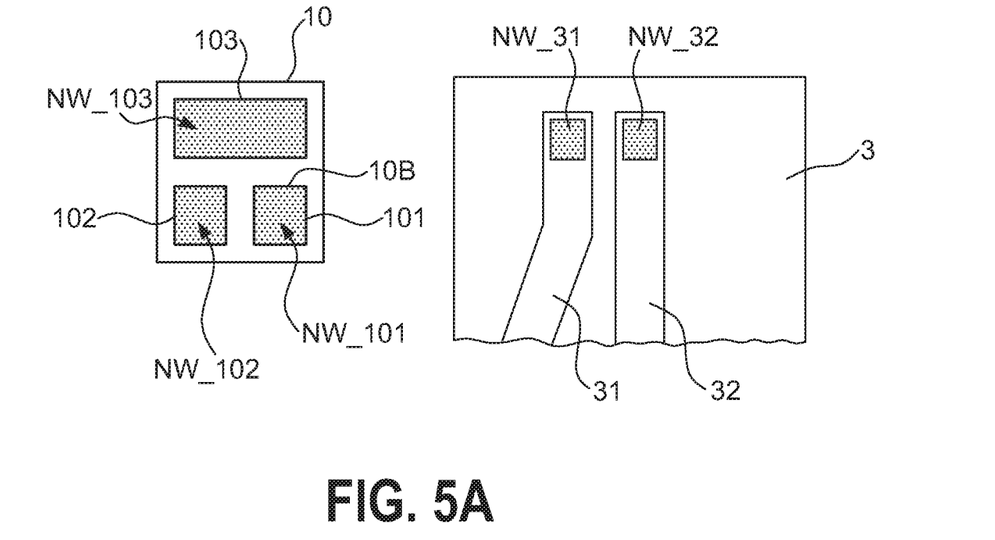
FIGS. 5A and 5B illustrate a further embodiment of the inventive LED assembly.
Figure 5B:
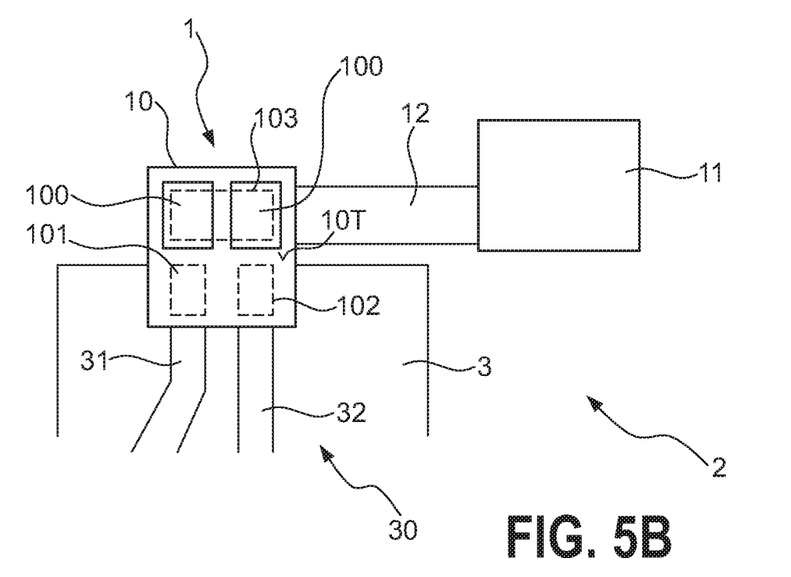

FIG. 5A shows an LED package 10P prepared for use in a further preferred embodiment of the inventive LED assembly 1. The LED package 10P can be electrically connected into a circuit as illustrated in the exemplary embodiment of a lighting arrangement 2 shown in FIG. 5B. In a similar manner to the embodiment of FIG. 3A, the thermal contact region 103 of the LED package 10P has been prepared by growing a nanowire field NW_103 over the area of the thermal contact region 103. In addition, the anode contact region 101 and the cathode contact region 102 have also been prepared by growing nanowire fields NW_101, NW_102 in these regions. The LED package 10P can be thermally connected to a heatpipe 12 as described in FIG. 3B or FIG. 4B above. The diagram also shows part of a PCB 3 with complementary nanowire fields NW_31, NW_32 formed to match the nanowire fields grown in the anode contact region 101 and the cathode contact region 102. FIG. 5B shows the LED package 10P viewed from above, and only schematically indicates the positions of the thermal contact region 103, and the electrode contacts 101, 102 through the top face 10T of the LED package 10P. To electrically connect the LED package 10P to the PCB 3, the two pairs of nanowire fields NW_101, NW_102, NW_31, NW_32 are pressed together. By using nanowire fields as described above for electrical and thermal connections of the LED package 10P, heat dissipation from the LED package 10P can be very favourably optimised. Furthermore, assembly of the lighting arrangement 2 is simplified, since the thermal and electrical connections are easily made and only require the LED package 10P to be accurately positioned relative to the complementary nanowire fields of the heatpipe 12 and PCB 3 before pressing the respective parts together. The LED package 10P can be electrically mounted to the PCB first and then thermally mounted to the heatpipe 12, or vice versa.

Figure 6:
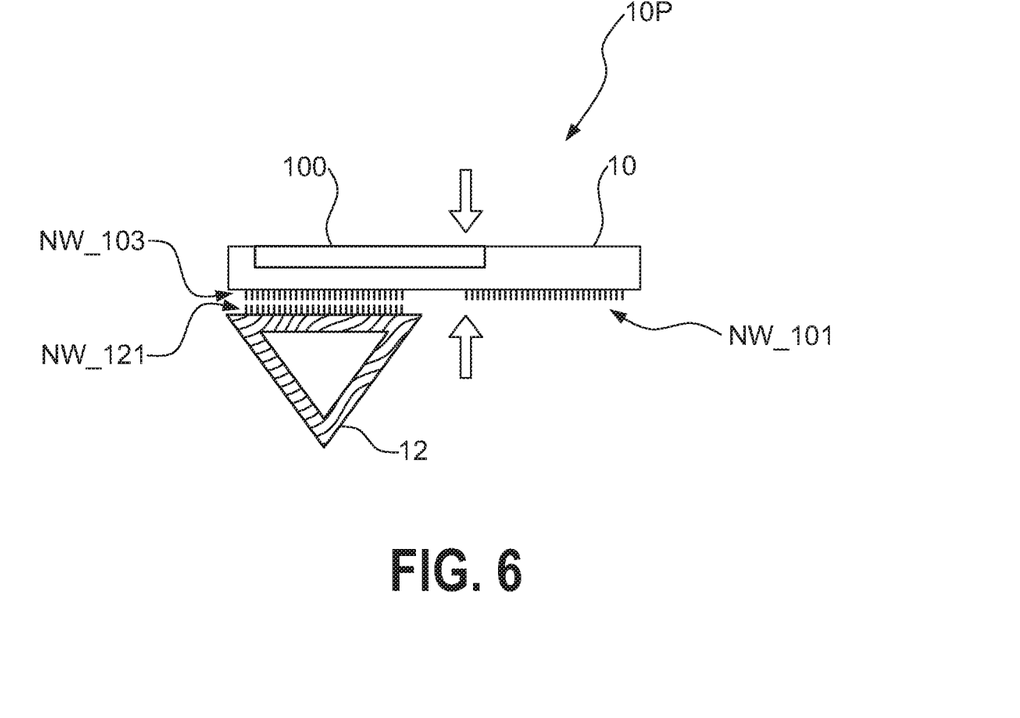
FIG. 6 shows a schematic cross-section through an embodiment of the inventive LED assembly.

FIG. 6 shows a schematic cross-section as an embodiment of the inventive LED assembly is being assembled, i.e. just prior to the formation of the nanoweld between the nanowire field NW_103 (formed in the thermal contact region of the LED package 10P) and the complementary nanowire field NW_121 (formed at a first end of the heatpipe 12). For the sake of clarity, the nanowires are shown in a greatly simplified manner. In reality, the nanowires will only have a thickness of less than 1.0 μm, a height in the region of 20 μm to 80 μm, e.g. 50 μm, and will be formed at a density of $10^3$-$10^6$ per mm$^2$.

Figures 7A, 7B:
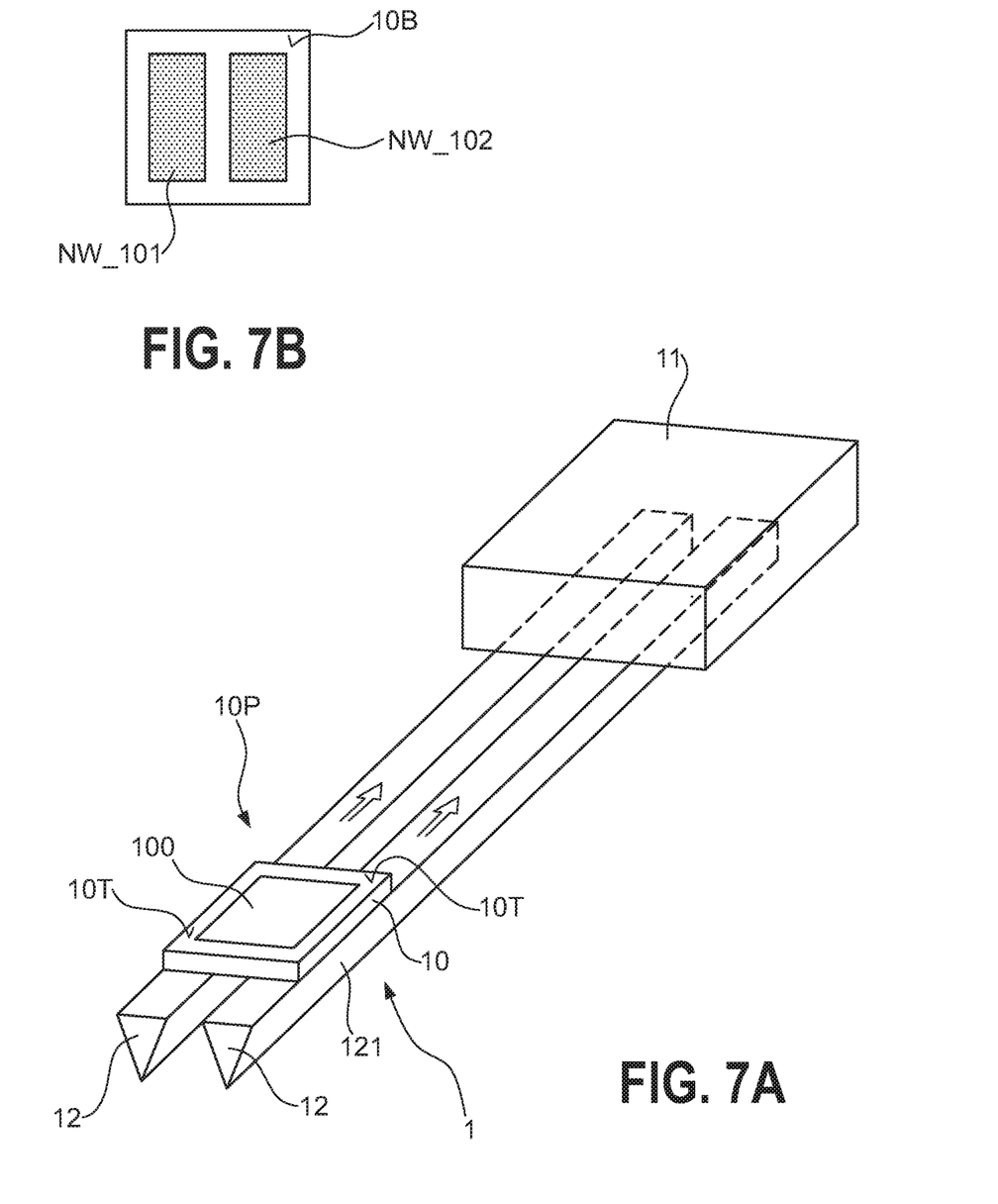
FIGS. 7A and 7B illustrate a further embodiment of the inventive LED assembly

FIG. 7 shows a further embodiment of the inventive LED assembly 1. Here, a dedicated thermal contact region is not required. Instead, heat from the anode contact region and cathode contact region is transported to a heatsink 11 using a pair of heatpipes 12. One heatpipe 12 extends between the anode contact region 101 and the heatsink 11, and another heatpipe 12 extends between the cathode contact region 102 and the heatsink 11. The heatpipes 12 are electrically isolated from each other. The thermal bonds can be formed in the manner described above, for example using nanowelds between nanowire lawns NW_101, NW_102 grown in the anode and cathode contact regions 101, 102 as shown in FIG. 7B and corresponding nanowire lawns grown in a suitable area of each heatpipe 12.

Although the present invention has been disclosed in the form of preferred embodiments and variations thereon, it will be understood that numerous additional modifications and variations could be made thereto without departing from the scope of the invention.

For the sake of clarity, it is to be understood that the use of "a" or "an" throughout this application does not exclude a plurality, and "comprising" does not exclude other steps or elements.

REFERENCE SIGNS

| | |
|---|---|
| LED assembly | 1 |
| carrier body | 10 |
| LED package | 10P |
| top surface | 10T |
| bottom surface | 10B |
| LED die | 100 |
| anode contact region | 101 |
| cathode contact region | 102 |
| thermal contact region | 103 |
| heatsink | 11 |
| thermal contact region | 113 |
| heatpipe | 12 |
| first end region | 121 |
| second end region | 122 |
| PCB | 3 |
| conductive track | 31, 32 |
| nanowire field | NW_103, NW_121 |
| nanowire field | NW_101, NW_102 |
| nanowire field | NW_113, NW_122 |
| nanowire field | NW_31, NW_32 |

What is claimed is:

1. A method of manufacturing an LED assembly, the method comprising:
   providing an LED package comprising one or more LEDs arranged in a support body and thermal and electrical contact regions on one or more surfaces of the support body;
   providing a heatpipe; and
   thermally coupling at least one of the thermal and electrical contact regions of the LED package and a first end region of the heatpipe, the thermally coupling including:
      performing electrolytic growth to prepare a nanowire field in the first end region of the heatpipe,
      performing electrolytic growth to prepare a complementary nanowire field in the at least one of the thermal and electrical contact regions of the support body, and
      pressing the LED package onto the heatpipe to engage the nanowire field and the complementary nanowire field.

2. The method according to claim 1, further comprising:
   providing a heatsink; and
   thermally coupling the heatsink and a second end region of the heatpipe.

3. The method according to claim 2, further comprising:
   performing electrolytic growth to prepare another nanowire field in the second end region of the heatpipe;
   performing electrolytic growth to prepare another complementary nanowire field on a surface of the heatsink; and
   pressing the heatsink onto the heatpipe to engage the other nanowire field and the other complementary nanowire field.

4. An LED assembly comprising: a heatpipe comprising a first nanowire field in a first end region of the heatpipe; an LED package comprising one or more LEDs in a support body, an anode contact region and a cathode contact region on an underside of the support body, a thermal contact region on the underside of the support body, and at least a second nanowire field in the thermal contact region, the LED package and the heatpipe thermally coupled together via a nanoweld between the second nanowire and the first nanowire field.

5. The LED assembly according to claim 4, further comprising at least one of a third nanowire field in the anode contact region and a fourth nanowire in the cathode contact region.

6. The LED assembly according to claim 4, wherein the support body comprises white silicone.

7. The LED assembly according to claim 4, wherein the one or more LEDs comprise two or more series-connected LEDs in the support body with a thickness of at most 0.5 mm.

8. The LED assembly according to claim 4, wherein the heatpipe is an elongate metal part extending between the LED package and a heatsink, and the heatsink is thermally connected to a second end region of the heatpipe.

9. The LED assembly according to claim 8, wherein the heatpipe has a triangular cross-section.

10. The LED assembly according to claim 8, wherein the heatpipe is hollow tube and formed from copper.

11. The LED assembly according to claim 10, wherein the heatpipe further comprises a working fluid inside the hollow tube.

12. The LED assembly according to claim 1, wherein ends of the hollow tube are closed.

13. An LED lighting arrangement comprising: an LED assembly comprising: a heatpipe comprising a first nanowire field in a first end region of the heatpipe, an LED package comprising one or more LEDs in a support body, an anode contact region and a cathode contact region on an underside of the support body, a thermal contact region on the underside of the support body, and at least a second nanowire field in the thermal contact region, the LED package and the heatpipe thermally coupled together via a nanoweld between the second nanowire and the first nanowire field; and a driver circuit comprising circuit components mounted on a PCB (3), driver circuit electrically coupled to the LED package via electrical connections between the anode and cathode contact regions of the LED package (10P) and corresponding conductive tracks (31, 32) on the PCB.

14. The LED lighting arrangement according to claim 13, further comprising a nanowire field on each of the anode contact region and the cathode contact region of the LED package and complementary nanowire fields on the corresponding conductive tracks (31, 32).

15. The LED lighting arrangement according to claim 14, wherein the electrical connections between the LED package and the driver circuit comprise nanowelds between the nanowire field on each of the anode contact region and the cathode contact region and the complementary nanowire fields on the conductive tracks.

16. The LED lighting arrangement according to claim 13, wherein the nanowire field one each of the anode contact region and the cathode contact region of the LED package and the complementary nanowire fields on the corresponding conductive tracks comprise metal nanowires grown from a seed layer with a density of the nanowires in a nanowire field in a region of 103-106 per mm2.

17. The LED lighting arrangement according to claim 13, wherein the nanowire field one each of the anode contact region and the cathode contact region of the LED package and the complementary nanowire fields on the corresponding conductive tracks have a length of at most 80 μm.

18. The LED lighting arrangement according to claim 13, wherein the nanowire field one each of the anode contact region and the cathode contact region of the LED package and the complementary nanowire fields on the corresponding conductive tracks have a length of at most 60 μm.

19. The LED lighting arrangement according to claim 16, wherein the nanowire field one each of the anode contact region and the cathode contact region of the LED package and the complementary nanowire fields on the corresponding conductive tracks have a length of at most 40 μm.

20. The LED lighting arrangement according to claim 13, wherein the heatpipe comprises a hollow tube with a triangular cross section and a working fluid within the hollow tube.

* * * * *